(12) United States Patent
Winkler et al.

(10) Patent No.: US 8,143,589 B2
(45) Date of Patent: Mar. 27, 2012

(54) STABLE EMISSION GAS ION SOURCE AND METHOD FOR OPERATION THEREOF

(75) Inventors: Dieter Winkler, Munich (DE); Udo Weigel, Munich (DE); Stefan Grimm, Kirchheim (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 379 days.

(21) Appl. No.: 12/420,384

(22) Filed: Apr. 8, 2009

(65) Prior Publication Data

US 2009/0260112 A1  Oct. 15, 2009

Related U.S. Application Data

(60) Provisional application No. 61/045,076, filed on Apr. 15, 2008.

(30) Foreign Application Priority Data

Apr. 15, 2008 (EP) ..................................... 08154576

(51) Int. Cl.
  *H01J 37/08* (2006.01)
(52) U.S. Cl. .................................. 250/423 R; 250/424
(58) Field of Classification Search ............. 250/423 R, 250/306, 307, 492.2, 492.1; 378/122, 123, 378/126; 850/16
See application file for complete search history.

(56) References Cited

U.S. PATENT DOCUMENTS

| | | | |
|---|---|---|---|
| 4,139,773 A * | 2/1979 | Swanson | 250/423 R |
| 7,123,689 B1 * | 10/2006 | Wilson | 378/122 |
| 7,368,727 B2 * | 5/2008 | Ward | 250/423 R |
| 7,737,414 B2 * | 6/2010 | Kuo et al. | 250/423 R |
| 7,939,800 B2 * | 5/2011 | Frosien | 250/306 |
| 2006/0231772 A1 * | 10/2006 | Jasinski | 250/492.1 |
| 2007/0051900 A1 | 3/2007 | Ward | |
| 2007/0158588 A1 * | 7/2007 | Zhou et al. | 250/492.2 |
| 2007/0228287 A1 | 10/2007 | Ward et al. | |
| 2009/0121160 A1 * | 5/2009 | Winkler et al. | 250/503.1 |

OTHER PUBLICATIONS

Extended European Search Report on Application No. 08154576.6-2208 Dated Sep. 29, 2008.

(Continued)

*Primary Examiner* — Jack Berman
*Assistant Examiner* — Johnnie Smith
(74) *Attorney, Agent, or Firm* — Patterson & Sheridan, L.L.P.

(57) ABSTRACT

A method of operating a focused ion beam device for emitting during operation a focused ion beam including ions of a gas generated at a first partial pressure, comprising cleaning an emitter tip positioned in an emitter tip region of the focused ion beam device, the cleaning comprises introducing the gas into the emitter tip region such that the gas has a second partial pressure of at least two times the first pressure. Further, a focused ion beam device is provided, comprising a gas field emitter tip (13) in an emitter tip region emitting an ion beam including ions of a gas, a gas inlet for supplying a gas with different pressures (110), a gas outlet (120), a pressure measurement device for measuring the pressure in the emitter tip region and a control unit (130) for controlling switching between an operation mode and a cleaning mode, further controlling the pressures in the emitter tip region and being connected to the pressure measurement device.

23 Claims, 7 Drawing Sheets

OTHER PUBLICATIONS

Hong-Shi Kuo et al "Noble Metal/W(111) Single-Atom Tips and Their Field Electron and Ion Emission Characteristics," Japanese Journal of Applied Physics, vol. 45, No. 11, 2006, pp. 8972-8983, published Nov. 8, 2006.

V. N. Tondare "Quest for high brightness, monochromatic noble gas ion sources," published Oct. 14, 2005.

K. Horiuchi, et al. "Emission characteristics and stability of helium field ion source," 8257B Journal of Vacuum Science & Technology/Section B, 6 May/Jun. (1998) No. 3, Second Series, Woodbury, NY, USA, accepted Feb. 12, 1988.

* cited by examiner

STABLE EMISSION GAS ION SOURCE AND METHOD FOR OPERATION THEREOF

CROSS-REFERENCE TO RELATED APPLICATIONS

This application claims benefit of European patent application serial number EP 08154576.6 filed Apr. 15, 2008, and this application claims benefit of U.S. provisional application Ser. No. 61/045,076 filed Apr. 15, 2008, which are both herein incorporated by reference.

BACKGROUND OF THE DISCLOSURE

1. Field of the Invention

The invention relates to a charged particle beam device and a method of operating a charged particle beam device. Particularly, it relates to a focused ion beam device having a gas field ion source, in particular for imaging, inspecting, and/or structuring a specimen. Further, it relates to a method of operating a focused ion beam device for emitting during operation a focused ion beam including ions of a gas. More specifically, it relates to a method for cleaning the emitter tip of an ion beam device.

2. Background of the Invention

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wave lengths at comparable particle energy.

Despite its improved characteristics with respect to brightness, source size and low energy spread, the stability of ion emitters has to be considered. Several mechanical stabilizing devices are known, such as a further connection of the emitter or special mountings.

Due to long-term use of the emitter and abrasion resulting therefrom, cleaning of the emitter and the surroundings is generally conducted. Thereby, an ultra high vacuum can be used which is typically better than $1.33*10^{-7}$ Pa ($10^{-9}$ Torr) and in particular better than $1.33*10^{-9}$ Pa ($10^{-11}$ Torr).

Furthermore, a heating method to reduce fluctuations which may result from contamination of the emitter can be conducted. By heating the emitter, contaminating particles may be released from the emitter and its surroundings. Thereby, it is possible to pump the released contaminating particles out of the emitter area and to improve the conditions of the vacuum.

SUMMARY OF THE INVENTION

In light of the above, a method for operating a focused ion beam device according to independent claim 1 and a focused ion beam device according to independent claim 18 are provided.

According to one embodiment, a method for operating a focused ion beam device is provided for emitting during operation a focused ion beam including ions of a gas generated at a first partial pressure, including cleaning an emitter tip positioned in an emitter tip region of the focused ion beam device, the cleaning includes introducing the gas into the emitter tip region such that the gas has a second partial pressure of at least two times the first pressure.

Further advantages, features, aspects and details that can be combined with embodiments described herein are evident from the dependent claims, the description and the drawings.

According to another embodiment, a focused ion beam device is provided including a gas field emitter tip in an emitter tip region emitting an ion beam including ions of a gas, a gas inlet for supplying a gas with different pressures, a gas outlet, a pressure measurement device for measuring the pressure in the emitter tip region, a control unit for controlling switching between an operation mode and a cleaning mode, further controlling the pressures in the emitter tip region and being connected to the pressure measurement device.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE INVENTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following description the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited which has to be examined or inspected or which has to be structured. A specimen includes a surface to be structured or on which layers are deposited, an edge, and typically a bevel.

As described above, the ion beam stability is a problem to be solved for ion beam devices. In order to provide an ion beam device more efficiently and therefore, to improve stability, it has been found that the stability of the ion beam correlates with the cleanliness of the emitter and/or the emitter region. Hence, the cleaning of the emitter and/or the emitter region helps to improve stability of the ion beam.

According to embodiments described herein, a method is provided which allows a simple and exhaustive cleaning of the emitter tip. Thereby, a more reliable and efficient operation of the ion beam device becomes possible. Further, in light of the fact that the requirements for the vacuum of the ion beam device are decreased compared with common cleaning techniques, a reduction of costs can be achieved.

Generally, focused ion beam devices can, for example, be based on liquid-metal ion sources or gas ion sources. Ions in gas ion sources can be produced by bombardment of electrons, atoms or ions with gas atoms or molecules or by exposing gas atoms or molecules to high electric fields or irradiation. Thereby, gas ion sources have been found to be potential candidates for focused ion beam FIB applications. Sources based on the field ionization process are known as gas field ion sources (GFIS). An ionization process takes place at high electric fields larger than $10^{10}$ V/m. The field may, for example, be applied between an emitter tip and a biased extraction aperture.

The emitter tip is biased to a positive potential with respect to a downstream extraction aperture, whereby an electric field strong enough to ionize the gas atoms in the vicinity of the tip of the emitter unit is generated. The area in the vicinity of the emitter, wherein the desired electric field is provided or more generally, wherein the generation of ions is conducted, may be referred to as an emitter region. Gas pressures of $10^{-6}$ mbar to $10^{-2}$ mbar are desirable near the tip of the emitter unit during the operation mode. Thereby, a gas gradient is typically used in order to, on the one hand, provide a sufficient amount of gas atoms or molecules in the emitter area and, on the other hand, to not disturb emitted ions by gas molecules provided in the gun chamber during operation.

Figure 1A:
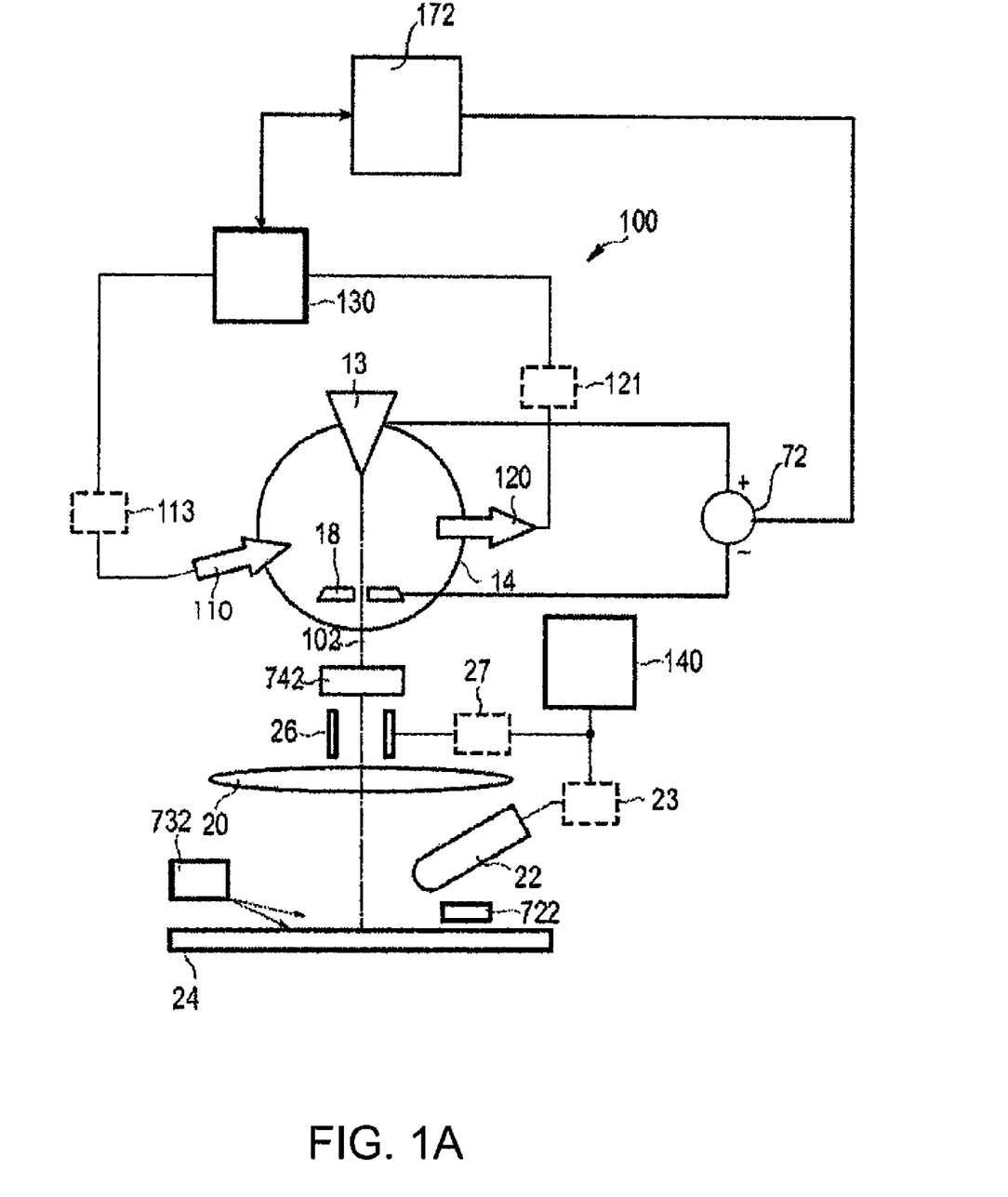
FIG. 1A shows a schematic view of a focused ion beam device according to embodiments described herein.

FIG. 1A shows a schematic view of a focused ion beam device 100, according to some embodiments. A gas inlet 110 to supply gas into the emitter tip region is provided. According to some embodiments, a gas outlet 120 to remove gas from the emitter tip region can be provided. According to some embodiments, the gas outlet may be provided in form of a connection to a vacuum pump or a connection to another region or chamber. The focused ion beam device further includes an enclosure 14 for housing a gas field ion source emitter with an emitter region for generating ions. According to different examples, which can be combined with any of the embodiments described herein, the emitter tip region is a chamber or an enclosure 14 that surrounds the emitter tip 13 partially or completely. According to embodiments described herein, different modes of use are provided, the operation mode and the cleaning mode.

In the operation mode, a focused ion beam including gas ions is emitted from the emitter tip 13. The gas ions are generated from a gas being in the enclosure 14 at a first partial pressure. The term "partial pressure" is used when talking about gas mixtures. Partial pressure is to be understood as the pressure of one gas in a mixture of gases. The partial pressure is the pressure the gas would have if it alone occupied the volume. The total pressure of the gas mixture is the sum of the partial pressures of each individual gas in the mixture.

In the cleaning mode, according to embodiments described herein, the gas is supplied to the emitter tip region with a second partial pressure, different from the partial pressure of the gas in the operation mode. The second partial pressure is, e.g., at least 2 times higher than the first partial pressure of the gas.

By applying a gas with the second partial pressure being at least two times higher than the first partial pressure, contaminating gases are replaced by the desired gas atoms not removed from the emitter tip region. Thereby, the emitter tip is not exposed to the contaminating particles but to the desired gas. The contaminating gases that occupy the emitter tip or regions of the emitter tip resulting in an unstable ion beam are replaced by the desired gas atoms or molecules. Accordingly, cleaning can be conducted at increased pressure. Contrary to commonly used UHV cleaning, this reduces the requirements for the vacuum necessary for the ion beam device, the vacuum pumps and saves costs.

According to embodiments described herein, the first partial pressure can typically be between $1*10^{-5}$ mbar and $1*10^{-2}$ mbar, more typically between $1*10^{-4}$ mbar and $1*10^{-3}$ mbar and even more typically between $5*10^{-4}$ mbar and $1*10^{-3}$ mbar. According to embodiments described herein, the second partial pressure can be between $1*10^{-3}$ mbar and 1 mbar, more typically between $1*10^{-2}$ mbar and $1*10^{-1}$ mbar.

According to some embodiments, which can be combined with other embodiments described herein, helium can be used as a gas. According to another embodiment, other gases such as hydrogen, methane, argon or neon can be used.

According to other embodiments, the used gas, such as helium, hydrogen or the like, may typically have a pureness of typically 99.999%, more typically of 99.9999% and even more typically of 99.99995%. In light of the pureness of the supplied gas, the partial pressure of the residual gases is low compared to the partial pressure of the supplied gas that means the partial pressure of the residual gases is insignificant compared to the partial pressure of the supplied gas. According to embodiments described herein, the residual gases are contaminating gases. For instance, if helium is used as the operating gas and the pureness of helium is 99.9999%, further assuming that only helium at this pureness is supplied to the emitter tip region, the ration of helium atoms to residual, contaminating atoms is $10^6$:1.

According to some embodiments described herein, an outlet 120 can be connected to a vacuum pump, a further vacuum chamber, or other means to support the control of the pressure in the enclosure 14. Thereby, the process parameters for ion beam generation can be controlled.

According to some embodiments described herein, an adjustable power supply 72 can be provided for supplying an extraction voltage between the emitter tip 13 and the electrode 18. The extraction voltage can be controlled by a controller 172. Further, the controller 172 may optionally also control the controller 130 for controlling the partial pressures of the gases.

Figure 1B:
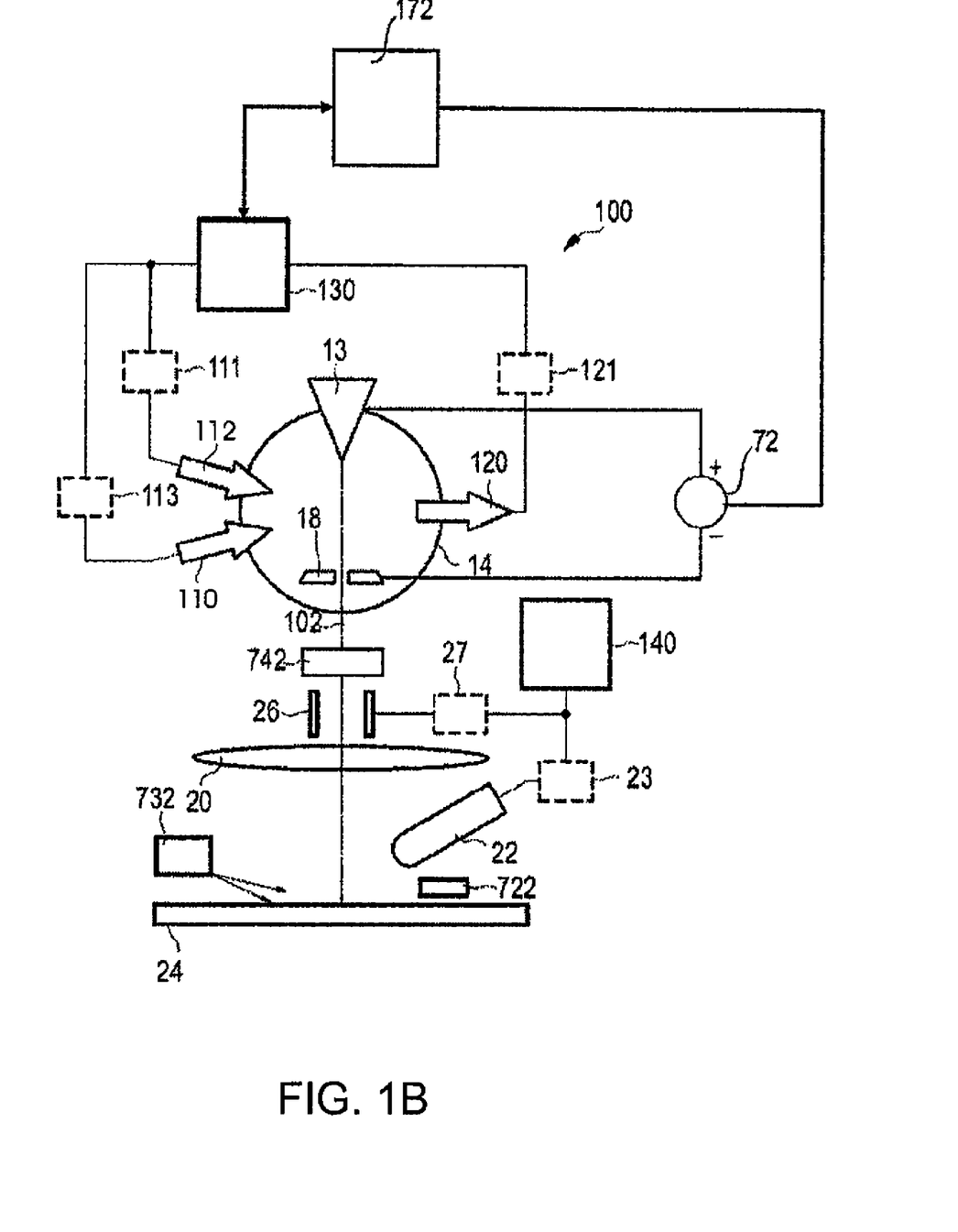
FIG. 1B shows a schematic view of another focused ion beam device according to other embodiments described herein.

Typically, the controller 130 controls the gas supply through the gas inlet and the gas exhaust through the gas outlet. Thereby, the controller 130 checks the pressure of the gas supplied to the chamber 14 and the necessity of gas outlet and the amount of gas which is released from the emitter tip region. The controller can also be a controller of the valves of the in- and outlets, the pumps and the like. According to different examples, which can be combined with any of the embodiments described herein, controllers 113 and 121 can be provided. These controllers are controllers for the individual inlets, outlets, valves, pumps and the like. According to embodiments described herein, as can be seen in FIG. 1B, a further controller 111 may be provided for a second gas inlet 112. As indicated by the dashed lines, these controllers may be omitted as they are redundant in case the controller 130 is able to control the components directly.

Further, according to some embodiments described herein, the controller can also control an emission detector 742 for detecting the emission current of the ion beam.

According to some embodiments, the voltage applied to the emitter, e.g., a voltage between an emitter and an extractor, can be switched off before starting the cleaning of the emitter tip. This may be beneficial in light of the pressure given during the cleaning mode. Typically, the voltage can be switched off during the time period of the cleaning mode. According to some embodiments, the switching off of the voltage is indicated by a cleaning indicator.

According to embodiments that can be combined with other embodiments described herein, the pressure necessary for the cleaning mode can be generated by increasing the gas flow at the inlet. Alternatively, the necessary pressure can also be obtained by decreasing the flow rate at the outlet or by a combination of increasing the gas flow at the inlet and decreasing the gas flow at the outlet. According to embodiments, the outlet may be a pump, a connection to another chamber with another pressure or the like. According to some embodiments, the pressure necessary for the operation mode after cleaning may be obtained by decreasing the flow rate at the inlet or increasing the flow rate at the outlet or a combination thereof.

According to some embodiments, the pressure during the cleaning mode is hold at a predetermined level and the flow rate can be increased in the cleaning mode compared to the flow rate at operation mode. The enhancement of the flow rate during the cleaning mode can be typically 100%, more typically 5 times, and even more typically 10 times of the flow rate at operation mode.

According to yet other alternative embodiments, the flow rate during the cleaning mode can be decreased compared to the flow rate during the operation mode while holding the pressure at a predetermined level. Thereby, the reduction of the flow rate can for instance be typically 30%, more typically 50%, and even more typically 90% of the flow rate at operation mode. According to still another embodiment, the gas in the emitter tip region can be stationary during the cleaning mode. That means that the gas is not removed or supplied over a certain time period. This time period may be the time interval of the cleaning mode.

Typically, during operation mode, a gas pressure gradient with the gun chamber can be provided. Thereby, the gas pressure is higher in the vicinity of the emitter and the emitter tip and is reduced towards an extraction electrode. Thereby, a sufficient amount of gas can be provided to the emitter tip during operation and the amount of gas that may disturb the ion emission is reduced. According to different examples, which can be combined with any of the embodiments described herein, the gas pressure gradient may reach from 1e-5 mbar to 5e-3 mbar, typically from 1e-4 mbar to 1e-3 mbar. According to some optional embodiments, the gas pressure may decrease further behind the extractor.

According to embodiments, which can be combined with other embodiments described herein, the emitter tip 13 in the emitter tip region can be heatable to remove residual contaminating gases from the emitter tip. Typically, the emitter tip is heated before starting the cleaning mode. More typically, the emitter tip is heated during the cleaning mode. By heating the emitter, the exchange of surface atoms is increased.

In FIG. 1B, a second gas inlet 112 is shown. According to different examples, which can be combined with any of the embodiments described herein, one gas inlet can be used for the gas supplied at the first partial pressure, the other gas inlet can be used for the gas supplied at the second partial pressure. The gas at first partial pressure is supplied to the emitter tip region for the operation mode, the gas at second partial pressure is supplied for the cleaning mode. According to embodiments described herein, any of the cleaning procedures described herein can be conducted after an installation of a new emitter tip and/or as a maintenance step, being repeated frequently during the life-time of the emitter.

According to embodiments described herein, a method for operating an ion beam device is provided. An ion beam including gas ions of a gas is generated at a first partial pressure by the emitter tip of the ion beam device. The gas can be supplied to the emitter tip region at a low pressure that is typically between $1*10^{-5}$ mbar and $1*10^{-2}$ mbar, more typically between $1*10^{-4}$ mbar and $1*10^{-3}$ mbar and even more typically between $5*10^{-4}$ mbar and $1*10^{-3}$ mbar.

The gas can be supplied at a second partial pressure through the same valve system and inlet 110. According to other embodiments described herein, the gas at the second partial pressure can be supplied to the emitter tip region through another valve system and inlet 112 as the gas at the first partial pressure. The second partial pressure of the gas may typically be two times, more typically ten times, typically up to 100 times the first partial pressure.

The high second partial pressure of the gas which is much higher than that of the contaminating gases due to their low concentration (for instance, at a pureness of 99.9999% of the operating gas, the concentration of the contaminating atoms in the operating gas is $1:10^6$), leads to an exchange of adsorbed contaminating atoms or molecules on the emitter surface or on surrounding surfaces by gas atoms at second partial pressure. A replacement of contaminating species by the desired gas at second partial pressure is thus achieved. Accordingly, cleaning does not necessarily require UHV pressures of $1*10^{-8}$ or below or $1*10^{-10}$ mbar or below.

According to further embodiments described herein, the mode of use can be switched between the operation mode at first partial pressure and the purging mode at second partial pressure. According to some embodiments, which can be combined with other embodiments described herein, the voltage applied to the emitter can be switched off before starting the cleaning mode and/or during adapting the pressure from the operation mode to the cleaning mode. Typically, the voltage can be switched off during the cleaning mode.

Figure 2:
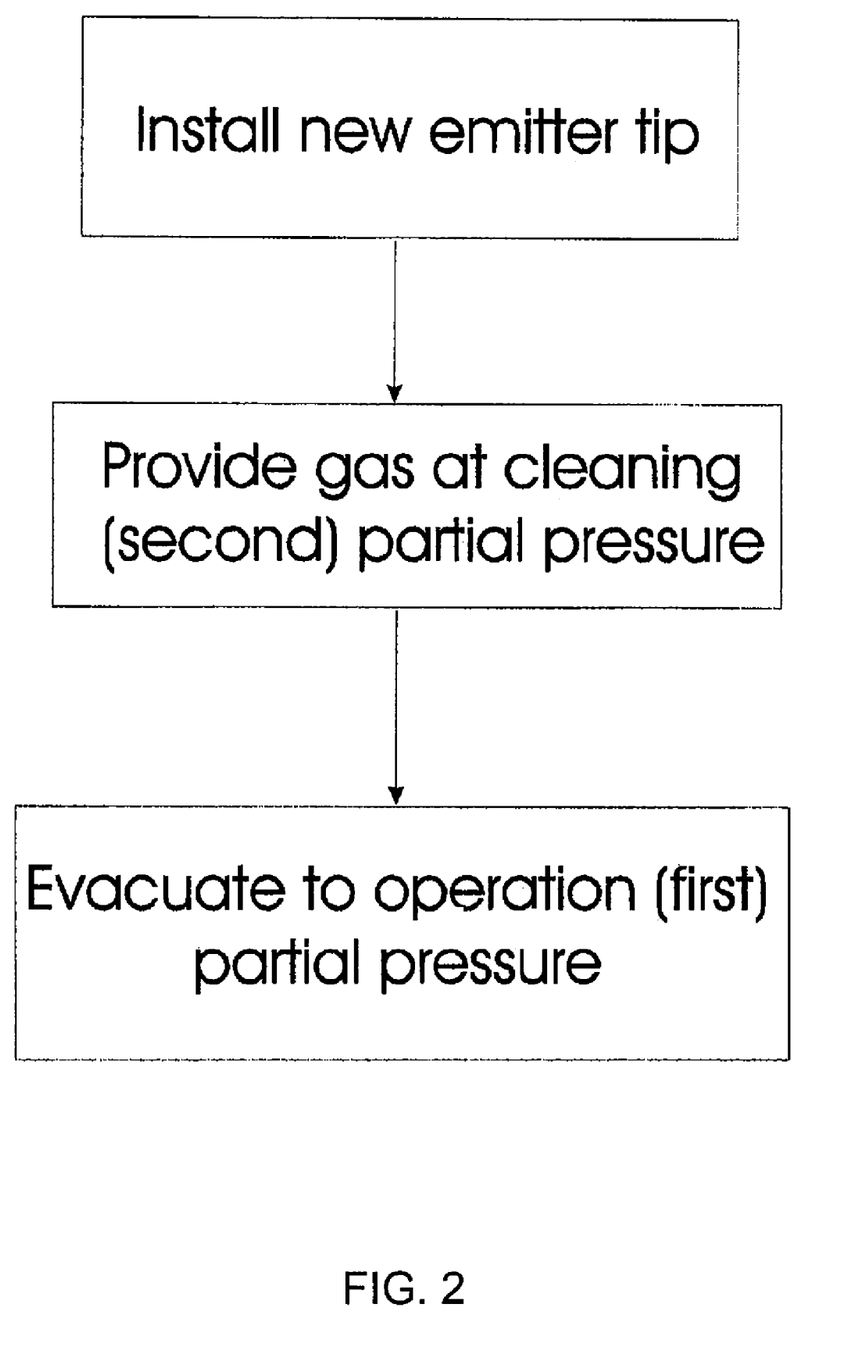
FIG. 2 shows a flowchart of a method of operating and/or maintaining a focused ion beam device according to embodiments described herein.

In FIG. 2 to 5, methods of different situations are shown. In FIG. 2, the use of the procedure after installation of a new emitter tip is depicted. After installation of a new emitter tip in the emitter tip region, the cleaning procedure is started by applying a gas, which is used for operating the gas field ion source, at second partial pressure, which is higher than a first partial pressure during operation, into the emitter tip region. According to embodiments described herein, the emitter tip region can be an enclosure or a chamber or the like. After a certain time interval that ensures a proper cleaning of the emitter tip and thereby a replacement of the contaminating atoms and molecules by desired gas atoms and molecules, the controller 130 decreases the pressure until the first partial pressure of the gas is reached. This may be done by opening the valves of the outlet. According to some embodiments, the gas present in the emitter tip region is evacuated and gas at first partial pressure is supplied through the gas inlets. After supplying the gas at the first partial pressure, the operation mode can be started and an ion beam can be emitted.

Figure 3:
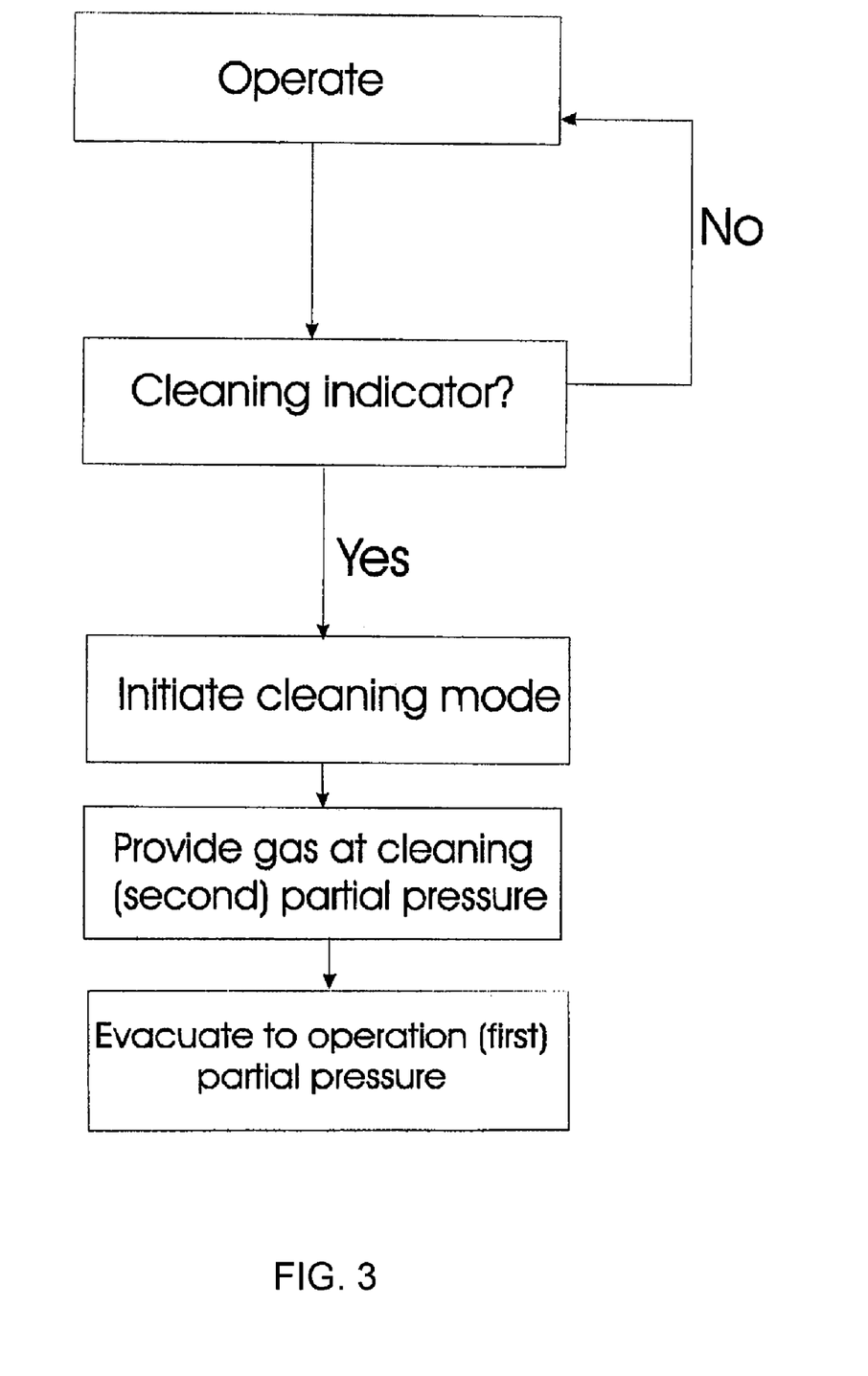
FIG. 3 shows a flowchart of another method of operating and/or maintaining a focused ion beam device according to embodiments described herein.

FIG. 3 shows the cleaning procedure performed as a maintenance step. Executing the cleaning procedure as a maintenance step can postpone the necessity of a new emitter tip due to abrasion. Therefore, the emitter tip can be operated for a longer time period and thus save costs. According to embodiments described herein, the cleaning mode is initiated, when cleaning is indicated by the cleaning indicator. According to some embodiments, the cleaning indicator may be a threshold value that is compared to a measured value of a parameter of the focused ion beam device. The comparison can e.g. be accomplished by the controller. According to some embodiments, the threshold value may be a threshold value for the emission current, the emission current variance or the like. Typically, a detector 742 can measure the emission current.

In the case that the emission current is, e.g., chosen as the threshold value, the emission current can be frequently measured. If the emission current falls below a certain level, the cleaning mode is initiated. This level is preferably predetermined and includes the threshold value for the emission current. The cleaning indicator can be monitored and used as a control parameter to initiate the cleaning process. For example, the measured variation of the emission current can be used to trigger the cleaning. The cleaning indicator is preferably measured frequently during operation. The measurement can be accomplished typically on a daily, hourly basis or at even shorter time intervals, such as every ten minutes, more typically every five minutes, and even more typically every two minutes.

According to yet other embodiments described herein, the parameter of the threshold value, for instance the emission current, can be measured continuously by measuring the current provided to the emitter tip. Typically, the emission current can be measured during operation of the focused ion beam device. For instance, if the amplitude of the emission current falls below a threshold value for the amplitude of the emission current, the cleaning mode is initiated. Alternatively, if the noise of the amplitude of the emission current exceeds a threshold value for the noise of the amplitude, the cleaning mode can also be initiated.

According to some embodiments described herein, the measurement of the emission current is done by an emission detector 742 and the measured value is passed to the controller. The controller monitors the measured value and compares it to a threshold value of the emission current.

Thereby, according to some embodiments, which can be combined with other embodiments described herein, if the measured value is equal to or less than the threshold value, the controller 130 initiates the cleaning mode. If the measured value of the parameter which is used as a cleaning indicator is higher than the threshold value, the operation will be continued. After initiating the cleaning mode, the operation mode is stopped and the cleaning mode is started. Starting the cleaning mode is done by supplying gas at the increased cleaning (second) partial pressure into the emitter tip region through the gas inlet. According to different embodiments described herein, the inlet can be the same inlet or can be different from the inlet the gas at first partial pressure supplied. According to different examples, which can be combined with any of the embodiments described herein, the gas can be helium.

For the cleaning mode, it is beneficial when the gas has a high pureness, in particular between typically 99.999%, more typically of 99.9999% and even more typically of 99.99995%. According to embodiments described herein the second partial pressure of the gas can be held in the chamber for a certain time interval, which is typically between 1 min and 30 min, more typically between 5 min and 20 min, and even more typically between 5 min and 10 min for cleaning during maintenance. If the cleaning is carried out after installation of a new emitter tip, the time period of cleaning can be more than 1 h, for example, between 1 h and 2 h. After this time period the gas at second partial pressure is evacuated from the emitter tip region. This may be done by opening the valves of the outlet. According to some embodiments, the gas present in the emitter tip region can be evacuated and gas at first partial pressure can be supplied through the gas inlets. After supplying the gas at the first partial pressure, the operation mode can be started and an ion beam can be emitted.

According to embodiments described herein, the cleaning can be accomplished frequently e.g. when the cleaning indicator identifies the necessity of cleaning. The cleaning indicator may be a threshold value for a certain parameter of the ion beam device. According to other embodiments, the cleaning mode can be initiated dependent on the operating time passed since the last cleaning was accomplished. The operation time passed can be typically 10 h, more typically 5 h, or even more typically 1 h or below. According to yet another embodiment, the cleaning is initiated dependent on the number of samples that were inspected with the ion beam device. For example, the cleaning mode can be started when the sample is changed. As mentioned above, in addition to or alternative to the maintenance of a gas field ion source emitter, the cleaning step may also be used for installation of a new emitter.

Figure 4:
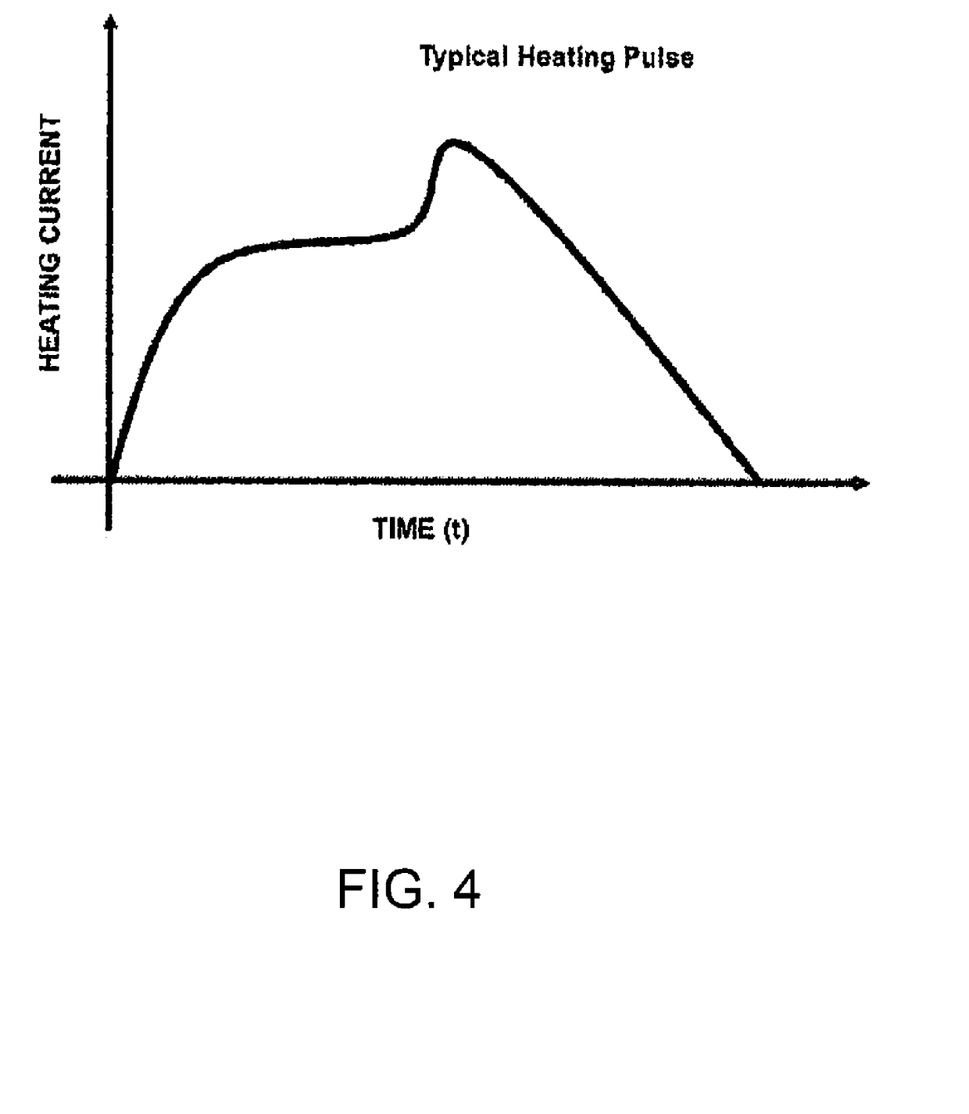
FIG. 4 shows the diagram of a typical heating pulse.

According to some embodiments, the cleaning at the second partial pressure can be supported by heating the emitter. Thereby, the efficiency of the cleaning process can be improved. FIG. 4 shows a typical heating pulse. The graph of FIG. 4 shows the heating current over the time. The heating pulse may be applied only once. According to another embodiment, the heating pulse can be repeated.

Frequent cleaning results in a continuously high and stable emission of the ion emitter.

Figure 5A:
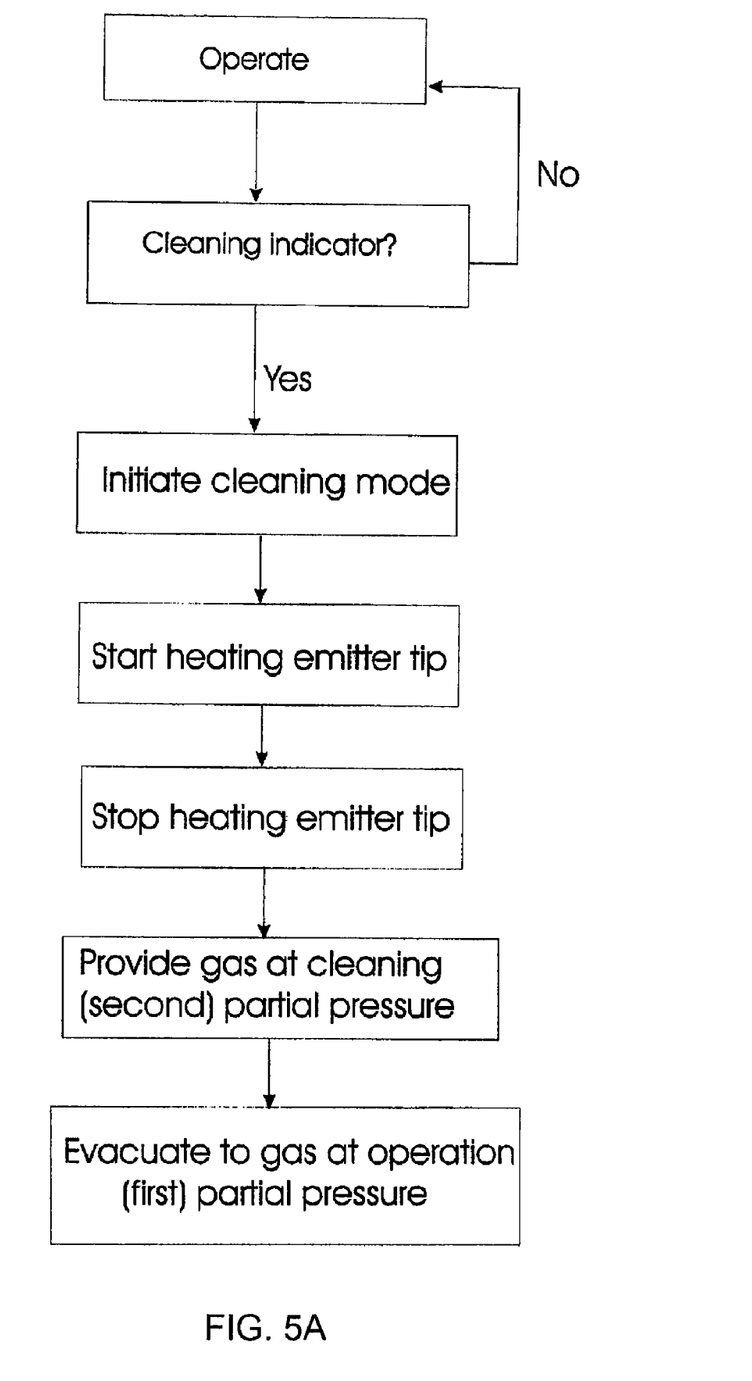
FIG. 5A shows a flowchart of yet another method of operating and/or maintaining a focused ion beam device according to embodiments described herein.

In FIG. 5A, a flow diagram shows a further embodiment. During operation, the cleaning indicator monitors the quality of the ion beam device operation. The quality may be controlled by a threshold value, by time measurement, by the number of specimen or the like. For instance, the emission current is measured and compared to a threshold value for the emission current. The comparison can be accomplished by a control unit or a controller. The measurement of the emission current can be done, e.g., by a current detector 742 which detects the emission current.

In case the measured value is used to check the process quality, two possibilities arise. If the threshold value is equal to or less than the threshold value, the controller 130 initiates the cleaning mode. If the measured value of the parameter which is used as a cleaning indicator is higher than the threshold value, the operation will be continued. After initiating the cleaning mode, the operation mode is stopped and the cleaning mode is started. According to different examples, which can be combined with any of the embodiments described herein, after stopping the operation mode, the emitter tip is heated for a certain time interval. The heating is preferably arranged by a heating pulse as shown in FIG. 4. The duration of a heating pulse can be chosen according to specific needs. During heating, the emitter tip is heated to a temperature, which can be in the range of about 800 K to 2000 K and typically of about 900 K to 1100 K.

After stopping the heating, the gas at second partial pressure is supplied to the emitter tip region. This is typically done by supplying gas at the second partial pressure into the emitter tip region through the gas inlet. According to embodiments described herein, the inlet can be different from the inlet the gas at first partial pressure supplied. According to some embodiments, the gas at second partial pressure can be supplied through two or more gas inlets simultaneously. The overall duration of a single cleaning process should be kept at a minimum to reduce interruptions of normal operation of the ion beam device.

According to embodiments described herein, the second partial pressure of the gas is held in the chamber for a certain time interval, which is typically between 1 min and 30 min, more typically between 5 min and 20 min, and even more typically between 5 min and 10 min for cleaning during maintenance. If the cleaning is carried out after installation of a new emitter tip, the time period of cleaning is typically more than 1 h, for example between 1 h and 2 h. After this time period the gas at second partial pressure is evacuated from the emitter tip region. This may be done by opening the valves of the outlet. According to some embodiments, the gas present in the emitter tip region is evacuated and gas at first partial pressure is supplied through the gas inlets. After supplying the gas at the first partial pressure, the operation mode can be started and an ion beam can be emitted.

Figure 5B:
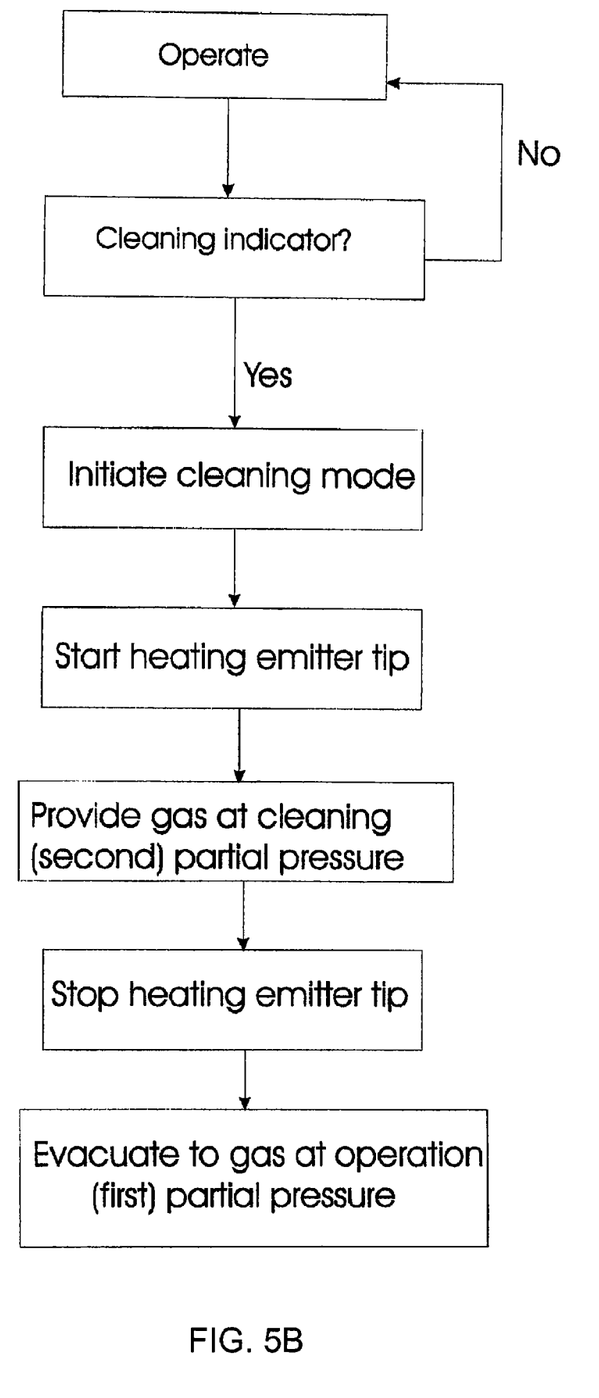
FIG. 5B shows a flowchart of still another method of operating and/or maintaining a focused ion beam device according to embodiments described herein.

In FIG. 5B, the method for operating and cleaning an ion beam device is shown according to other embodiments described herein. During operation, the cleaning indicator is monitored. According to embodiments described herein, the cleaning indicator may be a comparison between a threshold value and a measured value. The compared parameter may be e.g. the emission current which is measured by an emission deflector or the emission current variation or the like. The measured value is passed to the controller and compared to a threshold value for the parameter. If the measured parameter is equal to or less than the threshold value, the cleaning mode will be initiated and the operation mode will be stopped by the controller. If the measured parameter is higher than the threshold value, the operation will be continued.

After stopping the operation mode, the emitter tip is heated to a temperature which can be in the range of about 800 K to 2000 K and preferably of about 900 K to 1100 K. This temperature is held at an elevated level during the following steps. Alternatively, it is possible to provide one or more heating pulses as shown in FIG. 4. For instance, about 10 heating pulses as shown in FIG. 4, in particular 2 to 4 heating pulses can be applied. While heating the emitter tip, gas is supplied to the chamber until the partial pressure of the gas reaches the cleaning (second) partial pressure. The gas may be supplied through the same inlet as the gas at first partial pressure supplied or through a different inlet.

According to embodiments described herein, which can be combined with other embodiments described herein, the second partial pressure of the gas is held as described herein. After this time period the gas at second partial pressure is evacuated from the emitter tip region and the heating of the emitter tip is stopped. This can be initiated by the controller. The release of the gas may be done by opening the valves of the outlet. According to some embodiments, the gas present in the emitter tip region is evacuated and gas at first partial pressure is supplied through the gas inlets. After supplying the gas at the first partial pressure, the operation mode can be started and an ion beam can be emitted.

The above described invention allows a simplified and faster way to clean an emitter tip including its surroundings from adsorbates of unwanted gas species. Improved emission stability is attained by the presented method and the apparatus for accomplishing the method. To achieve the clean surface, a high partial pressure, which is typically between $1*10^{-3}$ mbar and 1 mbar, more typically between $1*10^{-2}$ mbar and $1*10^{-1}$ mbar, of the gas species which is used for field emission is provided in the emitter region prior to tip operation. Requirements of the necessary vacuum are decreased due to the fact that the contaminating gases are not removed from the emitter tip region but replaced by the operation gas.

According to yet further embodiments, which can be combined with other embodiments described herein, the cleaning mode can be initiated, when cleaning is indicated by the cleaning indicator, such as a threshold value for the emitted current, a threshold value for the stability of the current, or the like. Thereby, according to different options, cleaning can start directly if the cleaning indicator requests a cleaning of the emitter. In order to start directly with the cleaning process the normal operation might be interrupted. According to an alternative modification, the cleaning indicator might indicate that the cleaning has to be conducted in the near future, e.g., after the present specimen has been moved out of the system, during the next maintenance interval or with a given time period. Accordingly, it might be possible that a cleaning indictor does not force the present operation to be interrupted.

While the foregoing is directed to embodiments of the invention, other and further embodiments of the invention may be devised without departing from the basic scope thereof, and the scope thereof is determined by the claims that follow.

What is claimed is:

1. Method of operating a focused ion beam device for emitting during operation a focused ion beam including ions of a gas generated at a first partial pressure, comprising:
   cleaning an emitter tip positioned in an emitter tip region of the focused ion beam device, the cleaning comprises:
   introducing the gas into the emitter tip region such that the gas has a second partial pressure of at least two times the first partial pressure.

2. Method of operating a focused ion beam device according to claim 1, wherein the second partial pressure of the gas is of at least $5*10^{-3}$ mbar or above.

3. Method of operating a focused ion beam device according to claim 1, further comprising:
   supplying a voltage to the emitter tip;
   emitting a focusing ion beam having ion species of the gas in an operation mode;
   switching from the operation mode to cleaning as a cleaning mode.

4. Method according to claim 3, wherein the voltage supplied to the emitter tip is switched off for switching from the operation mode to the cleaning mode.

5. Method of operating a focused ion beam device according to claim 1, wherein the emitting of the focusing ion beam species is conducted at the first partial pressure being between $1*10^{-3}$ mbar and $1*10^{-5}$ mbar.

6. Method of operating a focused ion beam device according to claim 1, wherein the gas has a pureness of 99.999% or higher.

7. Method according to claim 1, wherein the gas selected is from the group consisting of helium, hydrogen, neon, argon and methane.

8. Method according to claim 1, wherein contaminating gases in the emitter tip region are replaced by the gas at the second partial pressure.

9. Method according to claim 1, wherein the emitter tip is heated before or during the cleaning.

10. Method according to claim 1, wherein the emitter tip is heated before and during the cleaning.

11. Method according to claim 1, wherein the cleaning is performed as a maintenance step and/or after installation of a new emitter tip.

12. Method according to claim 1, wherein the gas with the first partial pressure is supplied to the emitter tip region through the same inlet as the gas with the second partial pressure.

13. Method according to claim 3, wherein switching of the operation mode to the cleaning mode is initiated by monitoring a cleaning indicator.

14. Method according to claim 13, wherein the cleaning indicator comprises a threshold and a measured value of a parameter.

15. Method according to claim 1, wherein the second partial pressure of the gas is of $1*10^{-2}$ mbar or higher.

16. Method according to claim 1, wherein the second partial pressure of the gas is from $1*10^{-2}$ mbar to $1*10^{-1}$ mbar.

17. Focused ion beam device, comprising:
a gas field emitter tip in an emitter tip region emitting an ion beam including ions of a gas;
a gas inlet for supplying a gas to provide different pressures;
a gas outlet;
a control unit for controlling switching between an operation mode and a cleaning mode, and for controlling the pressures in the emitter tip region.

18. Focused ion beam device according to claim 17, wherein the control unit controls the gas supply through the gas inlet and the gas exhaust through the gas outlet.

19. Focused ion beam device according to claim 17, further comprising a heating element for heating the emitter tip.

20. Focused ion beam device according to claim 17, further comprising a second gas inlet for supplying gas into the emitter tip region.

21. Focused ion beam device according to claim 20, where the first and the second gas inlet supply the same gas.

22. Focused ion beam device according to claim 17, where control unit for switching is configured for introducing the gas into the emitter tip region such that the gas has a second partial pressure during cleaning of at least two times the first partial pressure during operation mode.

23. Focused ion beam device according to claim 22, wherein the control unit controls the second partial pressure of the gas to be at least $5*10^{-3}$ mbar or above.

* * * * *